(12) United States Patent
Komai

(10) Patent No.: US 12,163,220 B2
(45) Date of Patent: Dec. 10, 2024

(54) DEPOSITION METHOD AND DEPOSITION APPARATUS

(71) Applicant: Tokyo Electron Limited, Tokyo (JP)

(72) Inventor: Yu Komai, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 335 days.

(21) Appl. No.: 17/455,529

(22) Filed: Nov. 18, 2021

(65) Prior Publication Data

US 2022/0186371 A1    Jun. 16, 2022

(30) Foreign Application Priority Data

Dec. 16, 2020   (JP) .................................. 2020-208755

(51) Int. Cl.
| | |
|---|---|
| *H01L 21/02* | (2006.01) |
| *C23C 16/40* | (2006.01) |
| *C23C 16/455* | (2006.01) |
| *C23C 16/52* | (2006.01) |
| *H01J 37/32* | (2006.01) |

(52) U.S. Cl.
CPC ...... *C23C 16/45536* (2013.01); *C23C 16/401* (2013.01); *C23C 16/45544* (2013.01); *C23C 16/52* (2013.01); *H01J 37/3244* (2013.01); *H01J 37/32834* (2013.01); *H01L 21/02164* (2013.01); *H01L 21/02274* (2013.01); *H01L 21/0228* (2013.01); *H01J 2237/332* (2013.01)

(58) Field of Classification Search
CPC ............ C23C 16/401; C23C 16/45536; C23C 16/45544; C23C 16/52; H01J 37/3244; H01J 37/32834; H01L 21/02164; H01L 21/02274; H01L 21/0228
USPC ......................................................... 438/761
See application file for complete search history.

(56) References Cited

U.S. PATENT DOCUMENTS

2016/0020092 A1 *   1/2016   Kang ................. H01J 37/32917
                                                             438/789

FOREIGN PATENT DOCUMENTS

| JP | 2009-206500 | 9/2009 |
|---|---|---|
| JP | 2016-131238 | 7/2016 |
| WO | 2020/222853 | 11/2020 |

\* cited by examiner

*Primary Examiner* — Monica D Harrison
(74) *Attorney, Agent, or Firm* — IPUSA, PLLC

(57) ABSTRACT

A deposition method for depositing a silicon oxide film on a recess formed on a surface of a substrate in a process container includes: a) adsorbing a silicon-containing gas on a substrate; b) exposing the substrate to a plasma formed of an oxidizing gas containing an oxygen gas and an inert gas at a desired pressure; and c) repeating a) and b), wherein in b), a ratio between the oxygen gas and the inert gas is determined based on the desired pressure and association information in which ratios between the oxygen gas and the inert gas are associated with information regarding a loading effect for respective pressures in the process container.

4 Claims, 10 Drawing Sheets

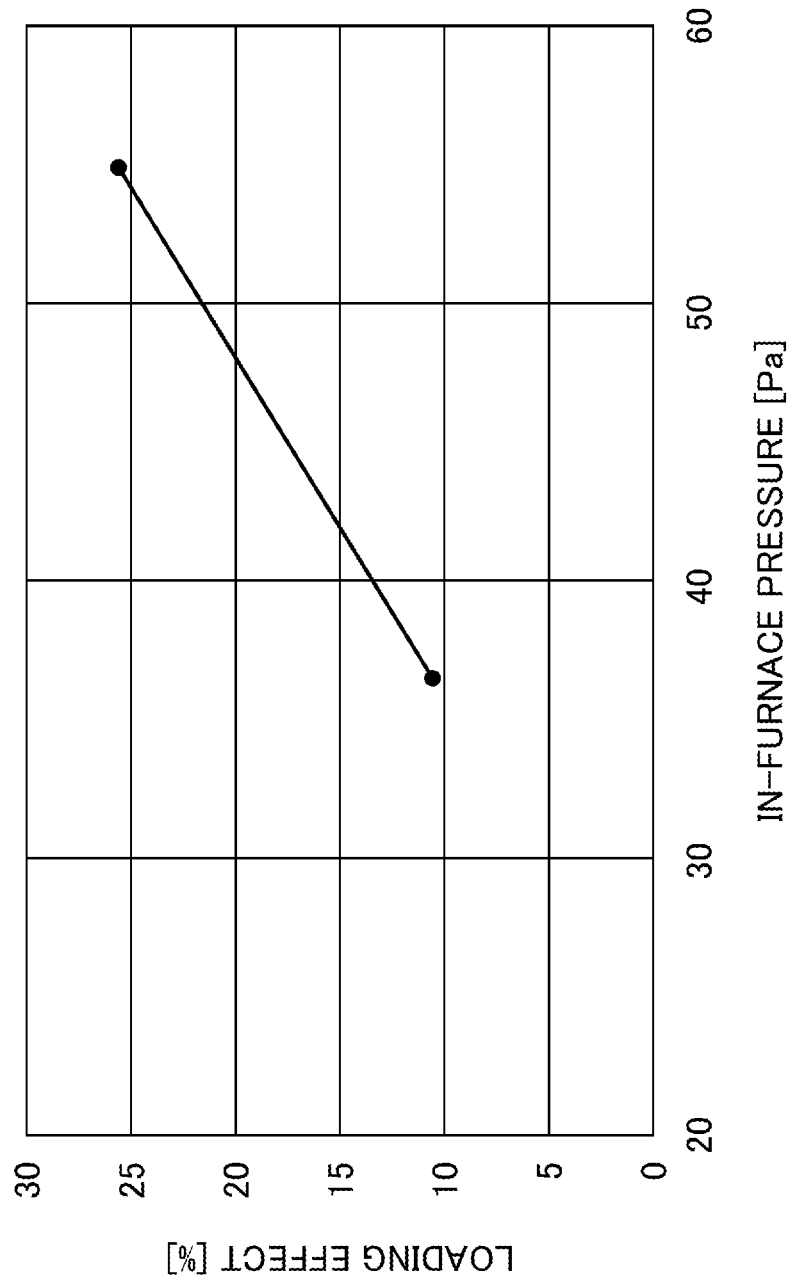

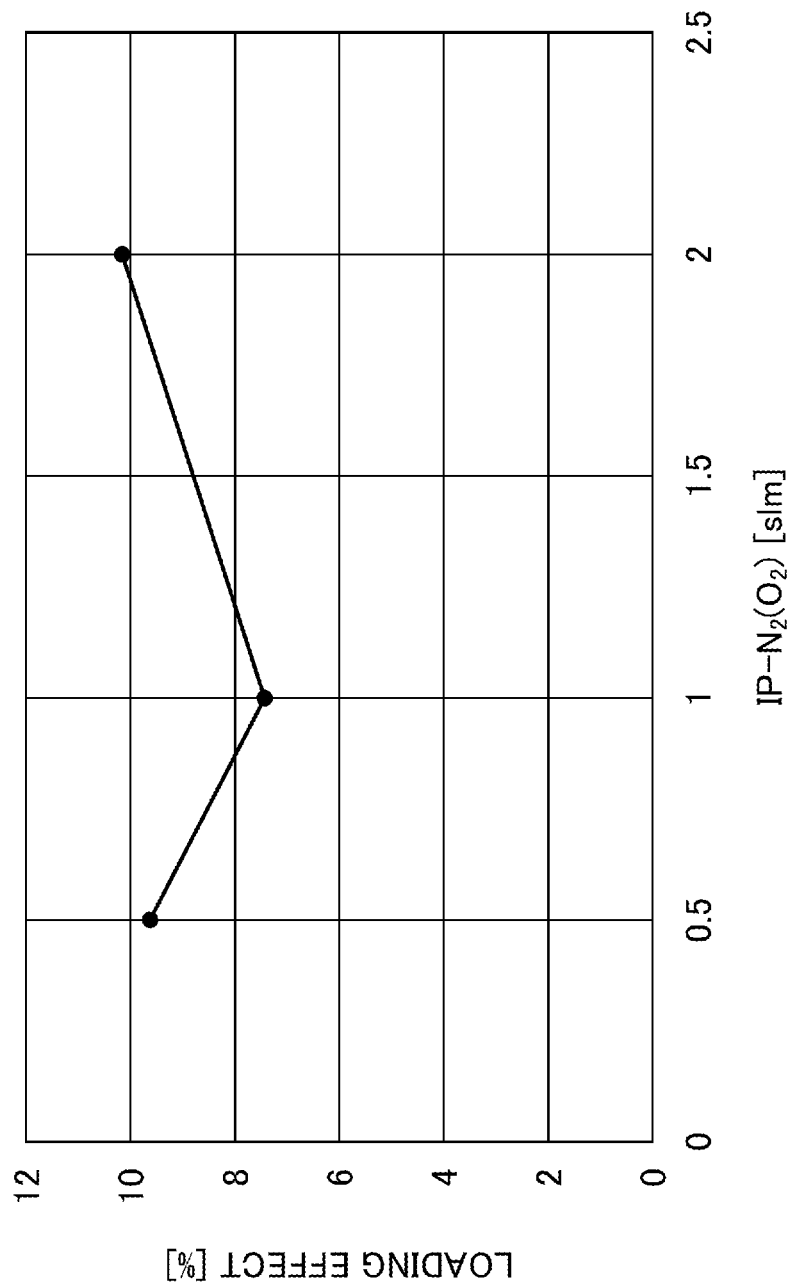

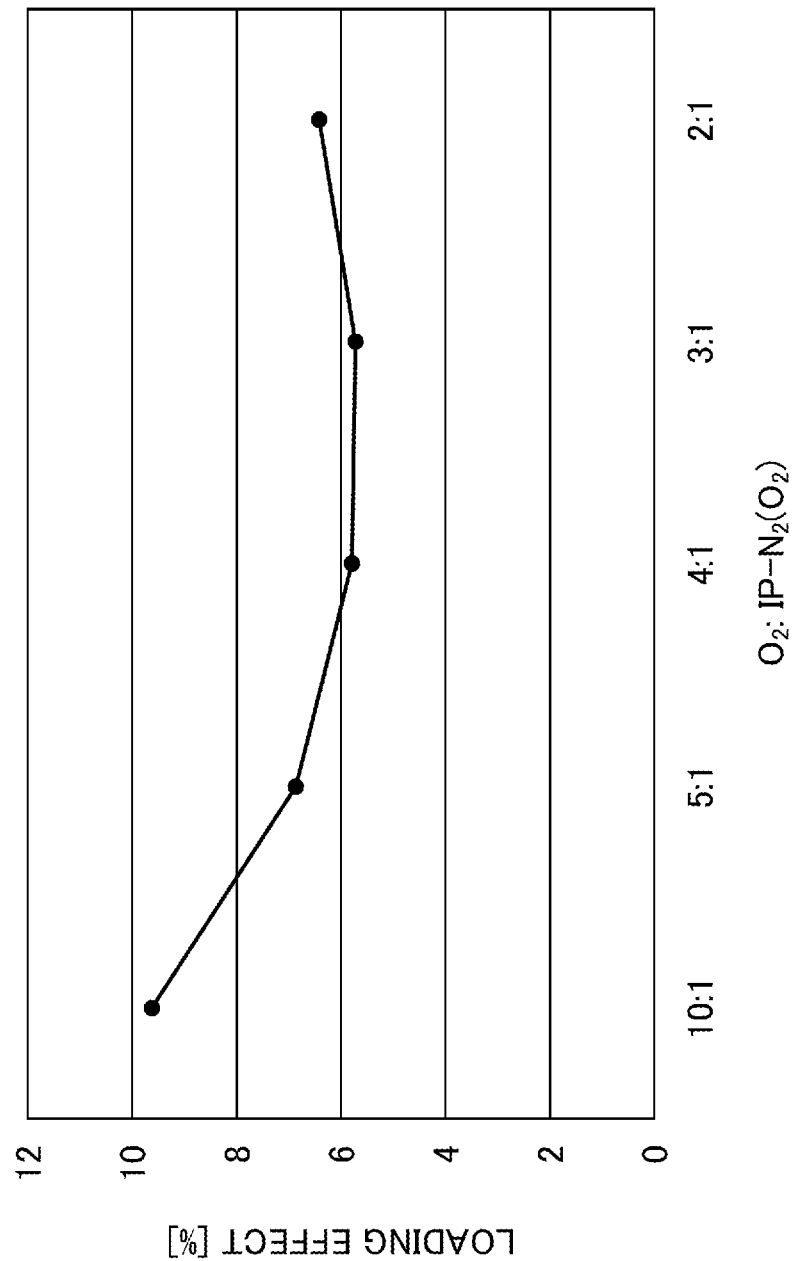

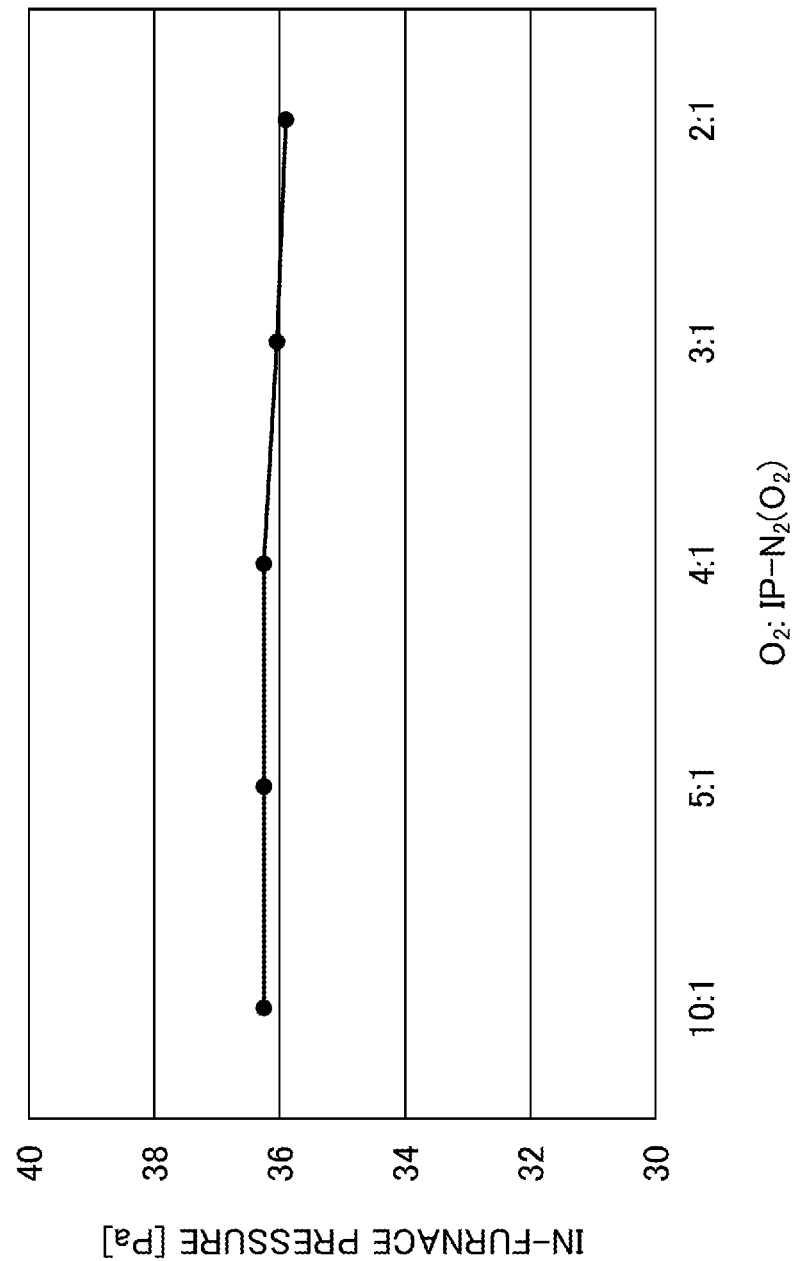

DEPOSITION METHOD AND DEPOSITION APPARATUS

CROSS-REFERENCE TO RELATED APPLICATION

The present application is based upon and claims priority to Japanese Patent Application No. 2020-208755, filed on Dec. 16, 2020, the entire contents of which are incorporated herein by reference.

BACKGROUND

1. Field

The present disclosure relates to a deposition method and a deposition apparatus.

2. Background Art

A technique is known in which a silicon oxide film is formed on a wafer W by repeatedly supplying diisopropylaminosilane and oxygen radical alternately in a reaction pipe at room temperature (see, for example, Patent Document 1).

PRIOR ART DOCUMENT

Patent Document

[Patent Document 1] Japanese Laid-open Patent Publication No. 2009-206500

The present disclosure provides a technique that can improve loading effectiveness at a desired pressure.

SUMMARY

According to one aspect of the present disclosure, a deposition method for depositing a silicon oxide film on a recess formed on a surface of a substrate in a process container includes: a) adsorbing a silicon-containing gas on a substrate; b) exposing the substrate to a plasma formed of an oxidizing gas containing an oxygen gas and an inert gas at a desired pressure; and c) repeating a) and b), wherein in b), a ratio between the oxygen gas and the inert gas is determined based on the desired pressure and association information in which ratios between the oxygen gas and the inert gas are associated with information regarding a loading effect for respective pressures in the process container.

According to the present disclosure, it is possible to improve loading effectiveness at a desired pressure.

BRIEF DESCRIPTION OF THE DRAWINGS

FIG. 6 is a diagram illustrating evaluation results of Example 1;

FIGS. 7A and 7B are diagrams illustrating evaluation results of Example 2; and FIGS. 8A and 8B are diagrams illustrating evaluation results of Example 3.

DESCRIPTION OF THE EMBODIMENTS

Figure 1:
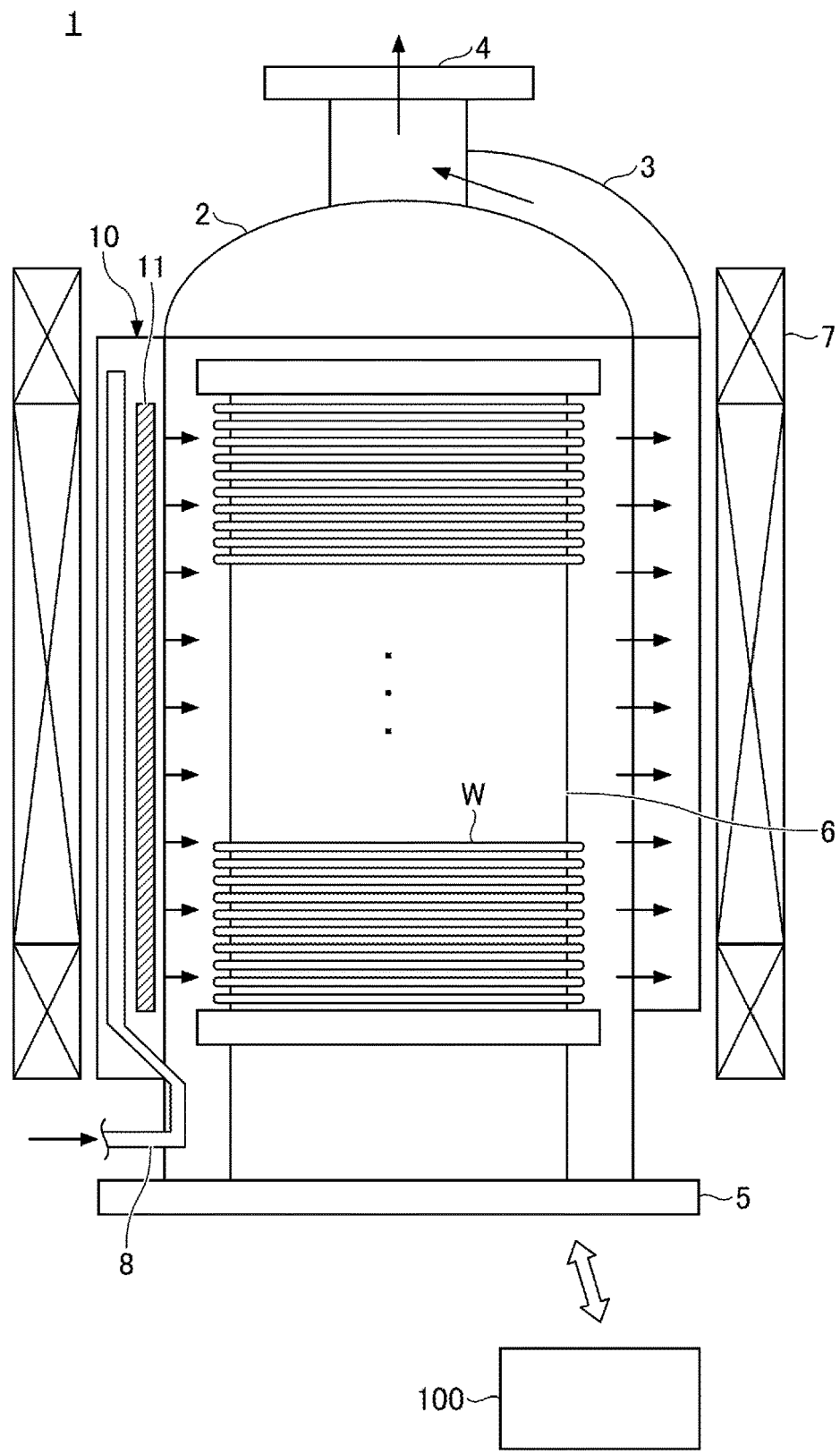
FIG. 1 is a schematic longitudinal cross sectional view illustrating an example of a deposition apparatus according to an embodiment.

In the following, a non-limiting exemplary embodiment of the present disclosure will be described with reference to the drawings. In every drawing, the same or corresponding members or parts are designated by the same or corresponding reference numerals, and duplicate description is omitted as appropriate.

[Deposition Apparatus]

Figure 2:
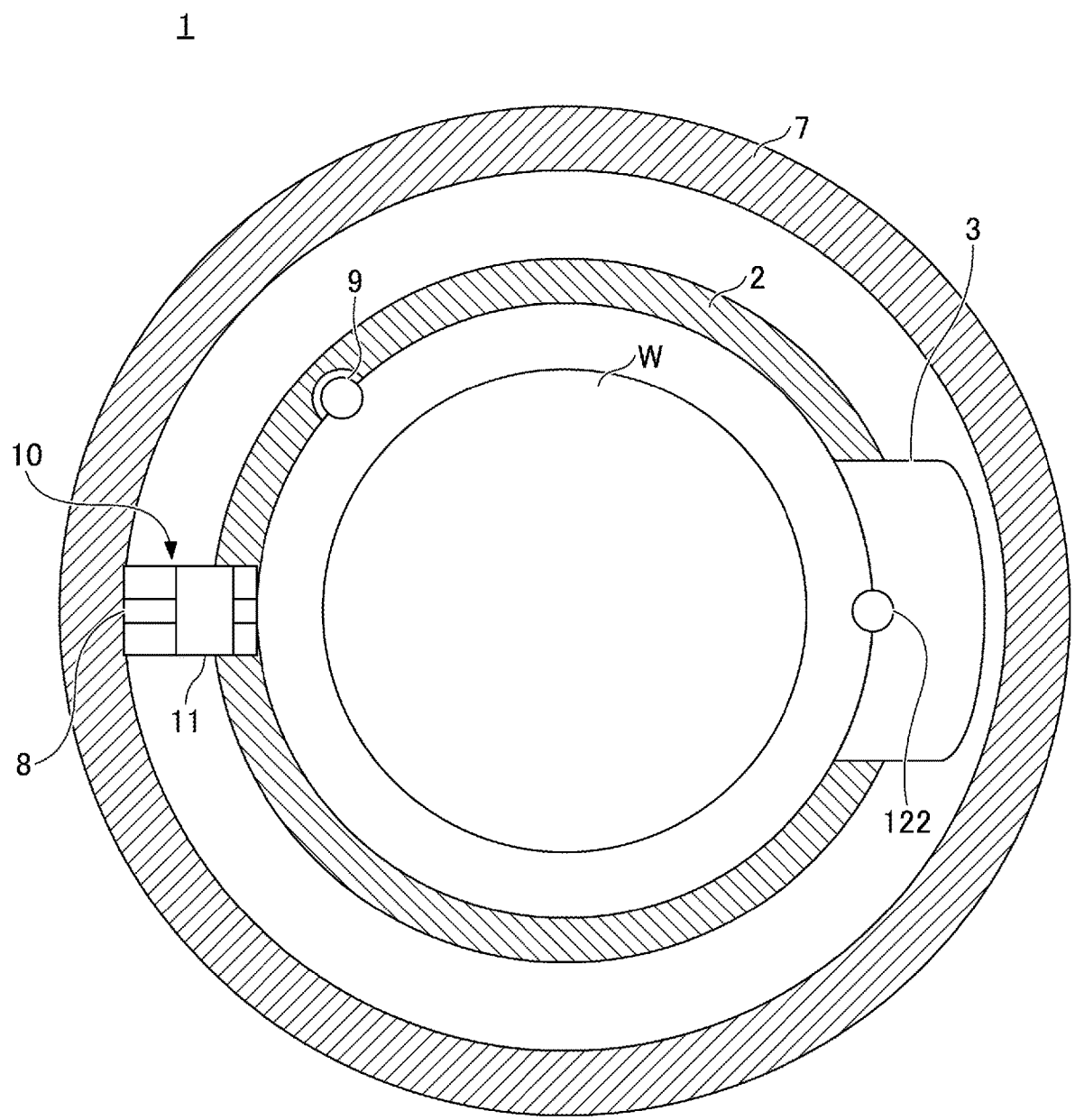
FIG. 2 is a schematic horizontal cross sectional view illustrating an example of the deposition apparatus according to the embodiment.
Figure 3:
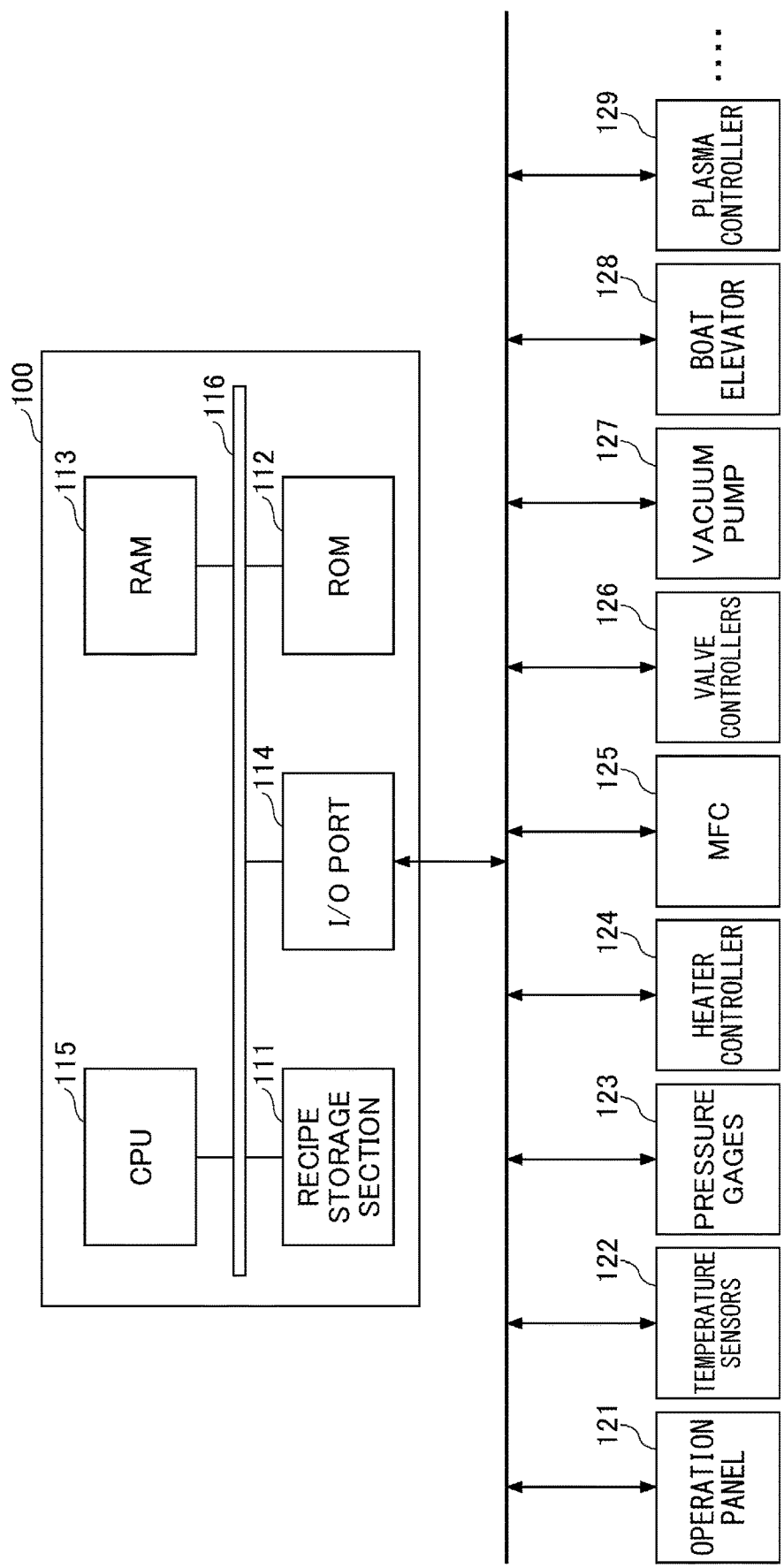
FIG. 3 is a diagram illustrating a configuration example of a controller of the deposition apparatus according to the embodiment.

Referring to FIG. 1 to FIG. 3, an example of a deposition apparatus according to an embodiment will be described. In the present embodiment, an example in which a silicon oxide film is formed by an atomic layer deposition (ALD) method will be described.

The deposition apparatus 1 includes a generally cylindrical process container 2 that has a ceiling and that is oriented vertically in the longitudinal direction. For example, the process container 2 may be made of a heat-resistant and corrosion-resistant material, such as quartz.

On one side of the process container 2, an exhaust section 3 is disposed for exhausting gas in the process container 2. The exhaust section 3 is formed to extend upwardly along the process container 2 and communicates with the process container 2 via an opening (not illustrated) provided on the side wall of the process container 2. The upper end of the exhaust section 3 is connected to an exhaust port 4 located at the upper section of the process container 2. An exhaust pipe (not illustrated) is connected to the exhaust port 4, and the exhaust pipe is provided with a pressure adjustment mechanism, such as a valve (not illustrated) and a vacuum pump 127, which will be described later. The pressure adjustment mechanism evacuates the gas in the process container 2 through the opening, the exhaust section 3, and the exhaust port 4 into the exhaust pipe and controls the inside of the process container 2 to a desired pressure (vacuum degree).

A lid 5 is disposed below the process container 2. For example, the lid 5 is made of a heat-resistant and corrosion-resistant material, such as quartz. The lid 5 is configured to be liftable and lowerable by a boat elevator 128, which will be described later below. When the lid 5 is lifted by the boat elevator 128, the lower side (furnace port section) of the process container 2 (load port) is closed. When the lid 5 is lowered by the boat elevator 128, the lower side (furnace port section) the process container 2 is opened.

A wafer boat 6 is placed on the lid 5. For example, the wafer boat 6 may be made quartz. The wafer boat 6 is configured to accommodate a plurality of semiconductor wafers W at predetermined intervals in the vertical direction. At the upper section of the lid 5, a thermally insulating cylinder that prevents the temperature inside the process container 2 from being lowered from the furnace port section of the process container 2, and a rotation table for rotatably mounting the wafer boat 6 accommodating the wafers W may be provided, and the wafer boat 6 may be mounted thereon. In such a case, the temperatures of the wafers W accommodated by the wafer boat 6 can be easily controlled to be uniform.

The process container 2 is surrounded by a temperature adjusting mechanism, such as heaters 7, which are made of, e.g., a resistive heating body. The inside of the process container 2 is set to a predetermined temperature by the heaters 7. As a result, the wafers W accommodated inside the process container 2 reach the predetermined temperature.

On the side surface near the lower end of the process container 2, process gas supply pipes 8 and 9, which supply a process gas into the process container 2, are inserted. In the present embodiment, gasses such as a source gas, an oxidizing gas, and a purge gas are used as the process gas. The source gas is a silicon-containing gas that causes the wafer W to adsorb a source (Si), and may be, for example, a diisopropylaminosilane (DIPAS) gas. The source gas is used in an adsorption step, which will be described below. The oxidizing gas is a gas that oxidizes the adsorbed source (Si), and may be, for example, an oxygen ($O_2$) gas. The oxidizing gas is used in an oxidation step, which will be described below. The purge gas is a gas that dilutes the process gas and may be, for example, an inert gas such as a nitrogen ($N_2$) gas.

The process gas supply pipe 8 supplies the oxidizing gas and the purge gas into the process container 2. The process gas supply pipe 8 is inserted through a plasma generator 10, which will be described later below. Therefore, the oxidizing gas and the diluting gas supplied from the process gas supply pipe 8 are plasma excited (activated). A dispersion injector, for example, may be used as the process gas supply pipe 8.

The process gas supply pipe 9 supplies the source gas and the purge gas into the process container 2. The process gas supply pipe 9 is disposed on the inner wall of the process container 2, as illustrated in FIG. 2. Therefore, the source gas and the purge gas supplied from the process gas supply pipe 9 are not plasma excited (activated). For example, a dispersion injector may be used as the process gas supply pipe 9.

Each of the process gas supply pipes 8 and 9 is provided with supply holes (not illustrated) at predetermined intervals in the vertical direction to supply the process gas from the supply holes into the process container 2. For this reason, as indicated by the arrows in FIG. 1, the process gas is supplied from a plurality of vertical locations into the process container 2. The respective process gas supply pipes 8 and 9 and the like are connected to process gas supply sources (not illustrated) via mass flow controllers (MFCs) 125, which will be described later below. It should be noted that FIG. 1 illustrates only the process gas supply pipe 8 (in the present embodiment, a process gas supply pipe for supplying an oxidizing gas) for supplying the process gas for performing a plasma process, which will be described later below. Also, FIG. 2 illustrates the process gas supply pipe 8 for supplying the oxidizing gas and the process gas supply pipe 9 for supplying the process gas not for performing a plasma process (in the present embodiment, a process gas supply pipe for supplying a source gas or a purge gas).

On the other side of the process container 2, i.e., on the side opposite to the side of the process container 2 where the exhaust section 3 is arranged, the plasma generator 10 is provided. The plasma generator 10 includes a pair of electrodes 11 and the like. The process gas supply pipe 8 is inserted between the pair of electrodes 11. A pair of electrodes 11 are connected to a radio frequency power source, a matching device (not illustrated), and the like. Applying radio frequency power from the radio frequency power source via the matching device between the pair of electrodes 11 causes plasma excitation (activation) of the process gas supplied between the pair of electrodes 11, for example, to produce oxygen radicals (O*). The oxygen radicals (O*) or the like are supplied from the plasma generator 10 into the process container 2.

For example, a plurality of temperature sensors 122 composed of a thermocouple for measuring the temperature within the process container 2, and a plurality of pressure gauges 123 for measuring the pressure within the process container 2 are disposed within the process container 2.

The deposition apparatus 1 includes a controller 100 that controls respective sections of the apparatus. FIG. 3 is a diagram illustrating a configuration example of the controller 100.

The controller 100 is connected to an operation panel 121, (a group of) temperature sensors 122, (a group of) pressure gages 123, a heater controller 124, MFCs 125, valve controllers 126, a vacuum pump 127, a boat elevator 128, a plasma controller 129, and so forth.

The operation panel 121 includes a display screen and operation buttons, and transmits operator's instructions to the controller 100, and displays various information transmitted from the controller 100 on the display screen.

The (group of) temperature sensors 122 measure the temperature at respective sections inside the process container 2, exhaust pipe, and so forth, and transmit the measured values of these to the controller 100.

The (group of) pressure gages 123 measure the pressure at respective sections inside the process container 2, exhaust pipe, and so forth, and transmit the measured values of these to the controller 100.

The heater controller 124 is configured to individually control the heaters 7. In response to an instruction from the controller 100, the heater controller 124 energizes and heats the heaters 7. Also, the heater controller 124 individually measures the power consumption of the heaters 7 and transmits the measured power consumption to the controller 100.

The MFC 125 is disposed in each pipe such as the process gas supply pipes 8 and 9, and controls the flow rate of the gas that flows through each pipe to the rate instructed by the controller 100. The MFC 125 also measures the flow rate of the actually flowing gas and reports the measured flow rate to the controller 100.

The valve controllers 126 are respectively disposed on pipes and control the opening degree of valves disposed on the pipes to be at values instructed from the controller 100.

The vacuum pump 127 is connected to the exhaust pipe and exhaust gas from inside the process container 2.

The boat elevator 128 is lifts the lid 5 so as to load the wafer boat 6 (wafers W) into the process container 2. The boat elevator 128 lowers the lid 5 so as to unload the wafer boat 6 (wafers W) from the process container 2.

The plasma controller 129 is configured to control the plasma generator 10 in response to instructions from the controller 100, so that oxygen supplied into the plasma generator 10 is activated to generate oxygen radicals, for example.

The controller 100 includes a recipe storage section 111, a ROM 112, a RAM 113, an I/O port 114, and a CPU 115. These are inter-connected via a bus 116.

The recipe storage section 111 stores a setup recipe and a plurality of process recipes. After the deposition apparatus 1 is manufactured, only the setup recipe is initially stored. The setup recipe is executed when a thermal model or the like corresponding to a processing apparatus is formed. The process recipes are prepared respectively for heat processes to be actually performed by a user. The process recipes prescribe temperature changes at respective sections, pressure changes inside the process container 2, start/stop timing for supply of process gases, and supply rates of process gases, from the time wafers W are loaded into the process container 2 to the time the processed wafers W are unloaded.

The ROM 112 is a storage medium formed of an EEPROM, a flash memory, a hard disc, or the like and stores operation programs executed by the CPU 115 or the like.

The RAM 113 serves as a work area for the CPU 115 or the like.

The I/O port 114 is connected to the operation panel 121, the temperature sensors 122, the pressure gages 123, the heater controller 124, the MFCs 125, the valve controllers 126, the vacuum pump 127, the boat elevator 128, and the plasma controller 129, and controls output/input of data or signals.

The CPU (Central Processing Unit) 115 constitutes a center of the controller 100 and executes a control program stored in the ROM 112. The CPU 115 controls an operation of the deposition apparatus 1, in accordance with a recipe (process recipe) stored in the recipe storage section 111, following instructions from the operation panel 121. That is, the CPU 115 causes the (group of) temperature sensors 122, the (group of) pressure gages 123, and the MFCs 125 to measure temperatures, pressures, and flow rates at respective sections inside the process container 2, exhaust pipe, and so forth. Further, the CPU 115 outputs control signals, based on the measured data, to the heater controller 124, the MFCs 125, the valve controllers 126, and the vacuum pump 127, to control the respective sections mentioned above in accordance with the process recipe.

The bus 116 communicates information between the sections.

<Deposition Method>

Figure 4:
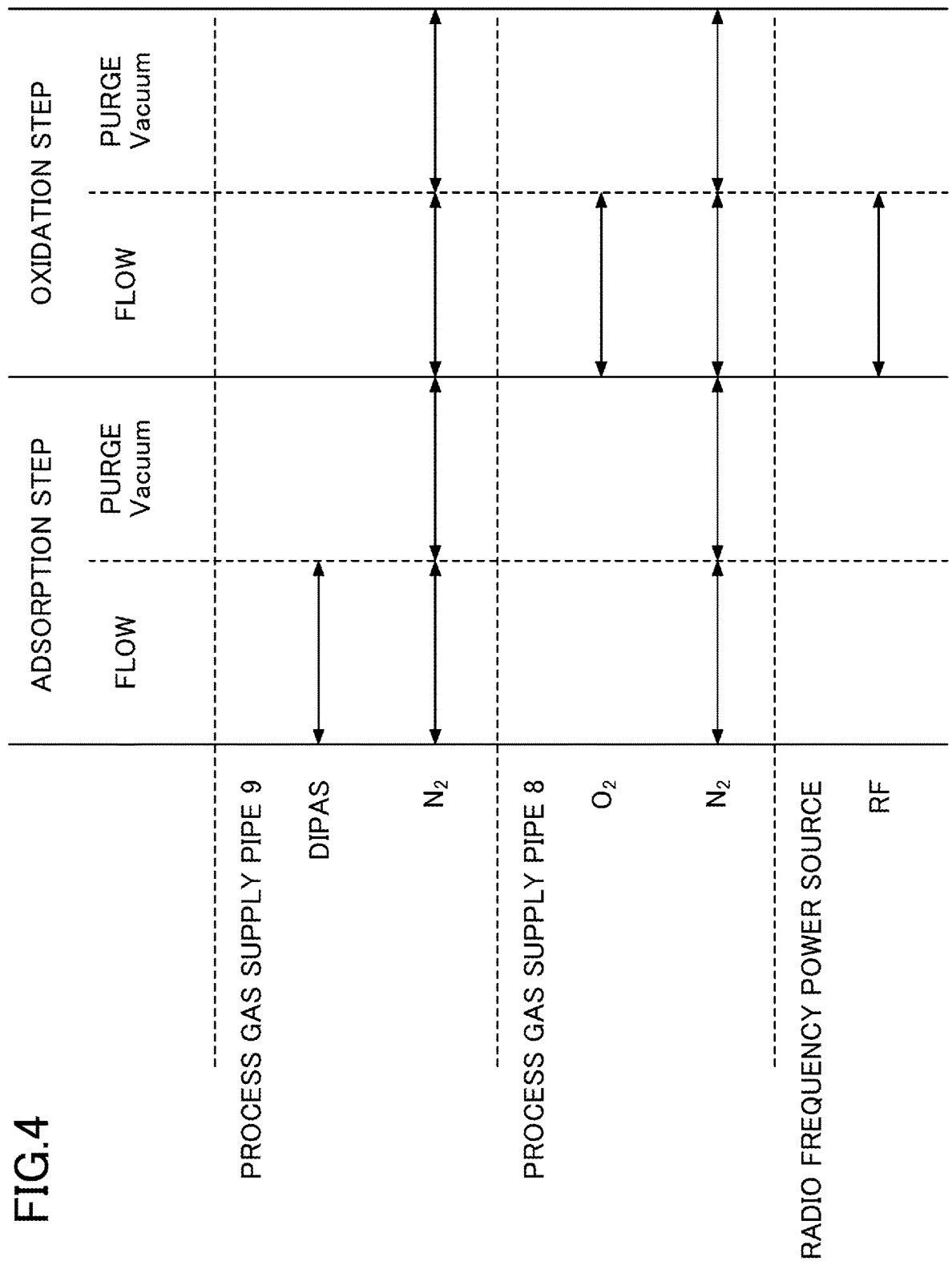
FIG. 4 is a diagram illustrating an example of a deposition method according to the embodiment.

Referring to FIG. 4, an example of a deposition method according to an embodiment will be described. In the deposition method according to the embodiment, a case in which a silicon oxide film is deposited on a wafer W by an ALD method using the above described deposition apparatus 1 is described as an example.

The deposition method according to the embodiment is a method for forming a silicon oxide film having a desired thickness on a wafer W by performing (repeating) a cycle including an adsorption step and an oxidation step by a predetermined number of times (e.g., 100 times). The adsorption step is a step of adsorbing a silicon-containing material (hereinafter referred to as "silicon" or "Si") containing silicon (Si) on the surface of the wafer W. The oxidation step is a step of oxidizing the Si adsorbed to the surface of the wafer W. In the present embodiment, a DIPAS gas is used as a source gas, a $O_2$ gas is used as an oxidizing gas, and a $N_2$ gas is used as a purge gas.

In the following description, the operations of the respective sections constituting the deposition apparatus 1 are controlled by the controller 100 (CPU 115). Further, the temperature, the pressure, and the flow rate of gas in the process container 2 in each process are set in conditions according to the recipe illustrated in FIG. 4 by the controller 100 (CPU 115) controlling the heater controller 124 (the heaters 7), the MFCs 125 (the process gas supply pipes 8 and 9), the valve controllers 126, the vacuum pump 127, and the plasma controller 129 (the plasma generator 10).

First, the wafer W is carried (loaded) into the process container 2. Specifically, the heaters 7 maintain the inside of the process container 2 at a predetermined load temperature, and a predetermined amount of $N_2$ gas is supplied into the process container 2. The wafer boat 6 accommodating the wafer W is mounted on the lid 5. The boat elevator 128 lifts the lid 5 and loads the wafer W (wafer boat 6) into the process container 2. It should be noted that a plurality of wafers W may be accommodated in the wafer boat 6 so that the plurality of wafers W are processed.

After the carry-in step, an adsorption is performed. The adsorption step is a step of supplying a source gas to the wafer W to adsorb Si on the surface thereof. In the present embodiment, Si is adsorbed on the wafer W by supplying a DIPAS gas to the wafer W.

In the adsorption step, first, the inside of the process container 2 is set to a predetermined temperature (e.g., room temperature). In the present embodiment, since the inside of the process container 2 is set to room temperature, the inside of the process container 2 is not heated by the heaters 7. In addition, the DIPAS gas and the $N_2$ gas are supplied from the process gas supply pipe 9 into the process container 2, and the $N_2$ gas is supplied from the process gas supply pipe 8 into the process container 2 (flow step).

The flow step of the adsorption step is performed for a predetermined period of time (e.g., 1 second to 10 seconds), and when a predetermined amount of Si is adsorbed on the surface of the wafer W, the supply of the DIPAS gas and the $N_2$ gas from the process gas supply pipe 9 and the supply of the $N_2$ gas from the process gas supply pipe 8 are stopped. Then, the gas in the process container 2 is discharged, and for example, a predetermined amount of the $N_2$ gas is supplied to the process container 2 from the process gas supply pipes 8 and 9 to discharge the gas in the process container 2 to the outside of the process container 2 (purge, Vacuum step).

After the adsorption step, the oxidation step is performed. The oxidation step is a step of oxidizing Si by exposing the wafer W on which Si is adsorbed to a plasma formed from an oxidizing gas.

In the oxidation step, the inside of the process container 2 is set to a predetermined temperature (e.g., room temperature). Also, the $O_2$ gas and the $N_2$ gas are supplied into the process container 2 at a predetermined ratio from the process gas supply pipe 8, and the $N_2$ gas is supplied into the process container 2 from the process gas supply pipe 9. Then, a radio frequency power at a predetermined output is applied between the electrodes 11 from a radio frequency power source (not illustrated) through a matching device (not illustrated). This causes the $O_2$ gas and the $N_2$ gas supplied between the electrodes 11 to be plasma excited (activated) to generate oxygen radicals (O*). The oxygen radicals generated as described above are supplied from the plasma generator 10 into the process container 2. When the oxygen radicals are supplied into the process container 2, Si adsorbed on the wafer W is oxidized and a silicon oxide film is formed on the wafer W (flow step). It should be noted that the flow step is performed, for example, in a state in which the inside of the process container 2 is evacuated by the vacuum pump 127.

In the flow step, at a ratio determined based on a desired pressure and association information in which the ratio between the $O_2$ gas and the $N_2$ gas is associated with information regarding the loading effect for each pressure in the in the process container 2, the $O_2$ gas and the $N_2$ gas are supplied from the process gas supply pipe 8 into the process container 2. This enables a silicon oxide film to be deposited under conditions that improve the loading effects at the desired pressure. The association information is calculated by, for example, experiments, simulations, or the like according to Examples, which will be described later, and stored in the recipe storage section 111, the ROM 112, or the like in advance. It should be noted that the loading effect is an index of the in-plane uniformity when a silicon oxide film is deposited on a wafer W on which a pattern is formed. Improving the loading effect means improving the in-plane uniformity of the film thickness, e.g., improving a decrease in the film thickness of the central section of the wafer W. In the present embodiment, the loading effect is evaluated by using the highest value in the values of the following formula (1) as an index value.

[Formula 1]

$$\text{LOADING EFFECT [\%]} = \frac{\text{FILM THICKNESS ON BARE WAFER} - \text{FILM THICKNESS ON PATTERN WAFER}}{\text{FILM THICKNESS ON PATTERN WAFER}} \times 100 \quad (1)$$

(1) In the formula (1), the film thickness on a bare wafer is a film thickness when a silicon oxide film is deposited on the bare wafer on which a pattern is not formed. The film thickness on a pattern wafer is a film thickness when a silicon oxide film is deposited, for the pattern wafer on which a pattern containing a recess is formed, under the same process conditions as the bare wafer. The loading effect is determined by the formula (1) by measuring the respective film thicknesses at multiple positions on the diameter of the wafer W and at respective measurement positions of the film thicknesses. The smaller the index value of the loading effect, the smaller the difference in film thickness from the bare wafer, and the better the loading effect.

The flow step of the oxidation step is performed for a predetermined period of time (e.g., 5 seconds to 100 seconds) and when a desired silicon oxide film is formed on the wafer W, the supply of the $O_2$ gas from the process gas supply pipe 8 is stopped and the application of radio frequency power from the radio frequency power source (not illustrated) is stopped. Also, the supply of the $N_2$ gas from the process gas supply pipes 8 and 9 is stopped. Then, the gas in the process container 2 is discharged, and a predetermined amount of the $N_2$ gas is supplied from the process gas supply pipes 8 and 9 into the process container 2 to discharge the gas in the process container 2 to the outside of the process container 2 (purge, Vacuum step).

Thereby, one cycle of the ALD method including the adsorption step and the oxidation step ends.

Subsequently, one cycle of the ALD method begins again with the adsorption step. Then, this cycle is repeated a predetermined number of times. Thereby, Si is adsorbed on the surface of the wafer W and the adsorbed Si is oxidized to further form a silicon oxide film. As a result, a silicon oxide film having a desired thickness is formed on the wafer W.

When the silicon oxide film having the desired thickness is formed on the wafer W, the wafer W is carried out (unloaded). Specifically, a predetermined amount of the $N_2$ gas is supplied from the process gas supply pipes 8 and 9 into the process container 2 to return the pressure in the process container 2 to an atmospheric pressure, and the inside of the process container 2 is maintained at a predetermined temperature by the heaters 7. The wafer W is subsequently unloaded by lowering the lid 5 by the boat elevator 128.

<Mechanism>

Figure 5A:
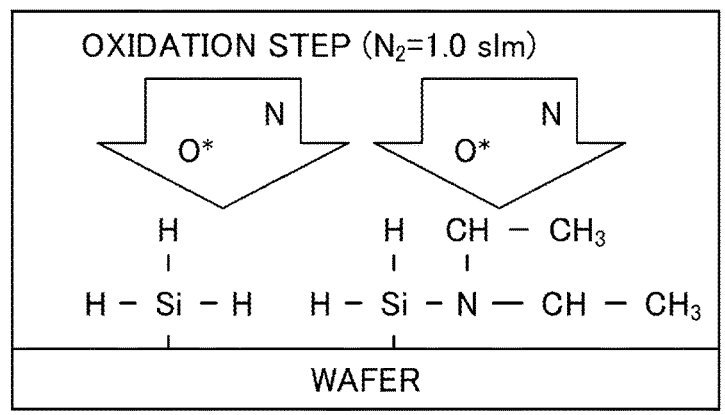
FIGS. 5A to 5C are diagrams illustrating a mechanism for improving a loading effect.
Figure 5B:
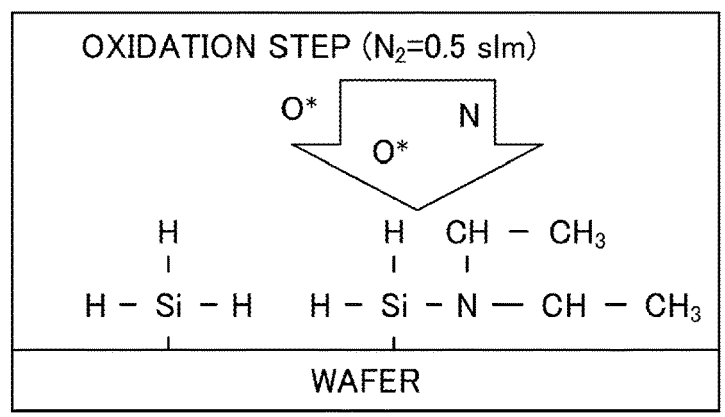
Figure 5C:
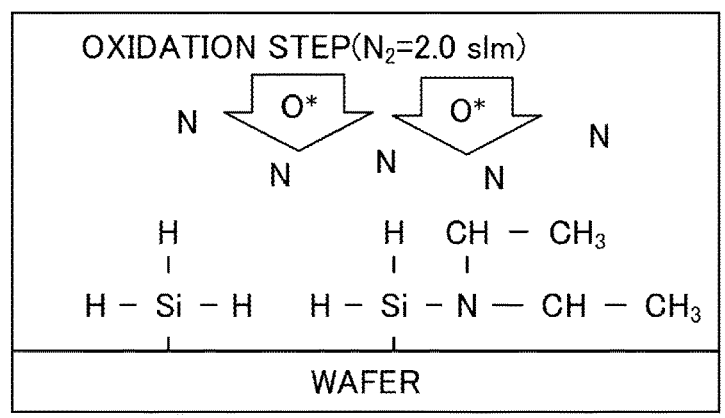

Referring to FIGS. 5A to 5C, a mechanism by which the loading effect is improved by the deposition method according to the embodiment will be described.

FIG. 5A is a diagram for explaining a surface reaction of the wafer W when the flow rate of the $N_2$ gas supplied to the wafer W (the flow rate of the $N_2$ gas supplied from the process gas supply tube 8) together with oxygen radicals (O*) is an appropriate rate in the oxidation step. In the oxidation step, in a case in which the flow rate of the $N_2$ gas supplied together with O* to the wafer W is appropriate, it is presumed that the loading effect is improved because the $N_2$ gas contributes to transport of O*, the mean free path of O* is lengthened, and the oxidation reaction is promoted.

FIG. 5B is a diagram for explaining a surface reaction of the wafer W when the flow rate of the $N_2$ gas supplied to the wafer W (the flow rate of the $N_2$ gas supplied from the process gas supply tube 8) together with oxygen radicals (O*) is small in the oxidation step. In the oxidation step, in a case in which the flow rate of the $N_2$ gas supplied together with O* to the wafer W is small, it is presumed that the contribution of the $N_2$ gas to transport of O* is small, the mean free path of O* is short, O* is deactivated before oxidizing the surface of the wafer W, and the loading effect is deteriorated.

FIG. 5C is a diagram for explaining a surface reaction of the wafer W when the flow rate of the $N_2$ gas supplied to the wafer W (the flow rate of the $N_2$ gas supplied from the process gas supply tube 8) together with oxygen radicals (O*) is large in the oxidation step. In the oxidation step, in a case in which the flow rate of the $N_2$ gas supplied together with O* to the wafer W is small, it is presumed that the loading effects are deteriorated because O* toward the wafer W is inhibited by the $N_2$ gas.

As described above, it can be said that it is effective to adjust the flow rate ratio between the $O_2$ gas and the $N_2$ gas as a method of improving the loading effect.

EXAMPLES

In Example 1, the effect on the loading effect when the pressure in the process container 2 (hereinafter referred to as the "in-furnace pressure") was changed in the deposition apparatus 1 was evaluated. In Example 1, for each of a bare wafer and a pattern wafer, a silicon oxide film was deposited under the process conditions (conditions A and B) illustrated in Table 1 below.

TABLE 1

| CONDI-TIONS | ADSORPTION STEP (FLOW) | | | OXIDATION STEP (FLOW) | | | | |
| --- | --- | --- | --- | --- | --- | --- | --- | --- |
| | DIPAS [slm] | IP—$N_2(O_2)$ [slm] | IP—$N_2(Si)$ [slm] | $O_2$ [slm] | IP—$N_2(O_2)$ [slm] | IP—$N_2(Si)$ [slm] | RF [W] | PRESSURE [Pa] |
| A | 0.9 | 0.5 | 5 | 5 | 0.5 | 1 | 250 | 55.0 |
| B | 0.9 | 0.5 | 5 | 5 | 0.5 | 1 | 250 | 36.5 |

It should be noted that "DIPAS" and "IP-N$_2$(Si)" in Table 1 indicate the flow rate of the DIPAS gas and the flow rate of the N$_2$ gas supplied from the process gas supply pipe 9 into the process container 2, respectively. Also, in Table 1, "O$_2$" and "IP-N$_2$(O$_2$)" indicate the flow rate of the O$_2$ gas and the flow rate of the N$_2$ gas supplied from the process gas supply pipe 8 into the process container 2, respectively. Also, in Table 1, "RF" indicates the output of radio frequency power applied between the pair of electrodes 11 from the radio frequency power source, and "pressure" indicates the in-furnace pressure.

As illustrated in Table 1, the conditions A and the conditions B are the conditions in which the in-furnace pressure was set to 55.0 Pa and 36.5 Pa in the flow step of the oxidation step, respectively, and all the conditions other than the in-furnace pressure are the same.

FIG. 6 is a diagram illustrating the evaluation result of Example 1, and illustrates the relationship between the in-furnace pressure and the loading effect. In FIG. 6, the horizontal axis indicates the in-furnace pressure [Pa] in the flow step of the oxidation step and the vertical axis indicates the loading effect [%]. The loading effect was calculated by the formula (1) described above.

As illustrated in FIG. 6, when the in-furnace pressure was set to 55.0 Pa and 36.5 Pa in the flow step of the oxidation step, the loading effect was 25.63% and 10.63%, respectively. The results illustrated that the loading effect was improved by lowering the in-furnace pressure.

In Example 2, in the deposition apparatus 1, the effect on the loading effect when the flow rate of the N$_2$ gas supplied with the O$_2$ gas (hereinafter, referred to as "IP-N$_2$(O$_2$)") from the process gas supply pipe 8 into the process container 2 was changed in the flow step of the oxidation step was evaluated. In Example 2, as in Example 1, a silicon oxide film was deposited for each of a bare wafer and a pattern wafer under the process conditions (conditions C to E) illustrated in Table 2 below.

Also, in Table 2, "RF" indicates the output of radio frequency power applied between the pair of electrodes 11 from the radio frequency power source, and "pressure" indicates the in-furnace pressure.

As illustrated in Table 2, the conditions C, the conditions D, and the conditions E are the conditions in which the flow rate of IP-N$_2$(O$_2$) was set to 0.5 slm, 1 slm, and 2 slm, respectively, in the flow step of the oxidation step, and all the conditions other than the IP-N$_2$(O$_2$) are the same.

Figure 7B:
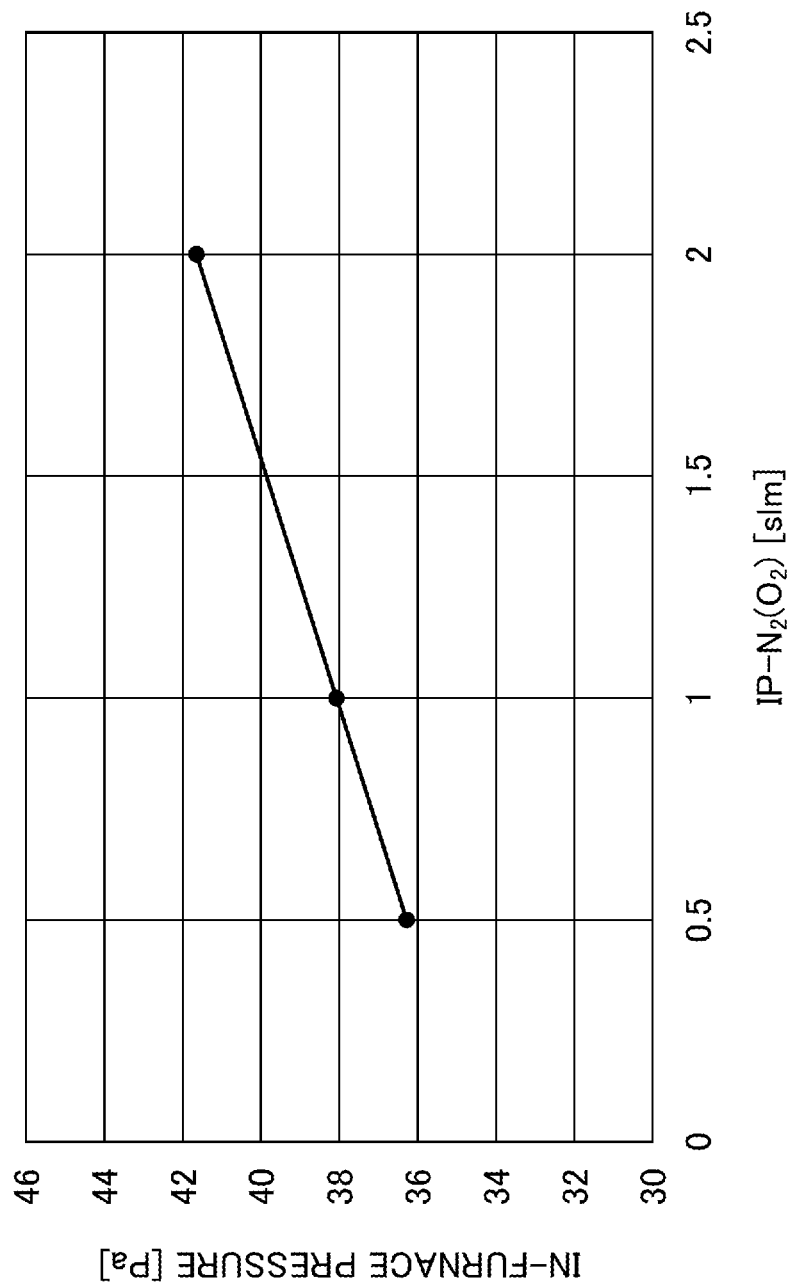

FIGS. 7A and 7B are diagrams illustrating the evaluation results of Example 2, in which FIG. 7A indicates the relationship between the flow rate of IP-N$_2$(O$_2$) and the loading effect, and FIG. 7B indicates the relationship between the flow rate of IP-N$_2$(O$_2$) and the in-furnace pressure. In FIG. 7A, the horizontal axis indicates the flow rate [slm] of IP-N$_2$(O$_2$), and the vertical axis indicates the loading effect [%]. In FIG. 7B, the horizontal axis indicates the flow rate [slm] of IP-N$_2$(O$_2$), and the vertical axis indicates the in-furnace pressure [Pa] in the oxidation step. The loading effect was calculated by the formula (1) described above.

As illustrated in FIG. 7A, when the flow rate of IP-N$_2$(O$_2$) was set to 0.5 slm, 1 slm, and 2 slm, the loading effect was 9.62%, 7.43%, and 10.14%, respectively. Also, as illustrated in FIG. 7B, when the flow rate of IP-N$_2$(O$_2$) was set to 0.5 slm, 1 slm, and 2 slm, the in-furnace pressure was 36.27 Pa, 38.13 Pa, and 41.67 Pa, respectively. The results indicated that by changing the flow rate of IP-N$_2$(O$_2$), the loading effect may be improved even under conditions in which the in-furnace pressure is high.

In Example 3, in the deposition apparatus 1, in the flow step of the oxidation step, the total flow rate of the O$_2$ gas and the N$_2$ gas supplied from the process gas supply pipe 8 into the process container 2 was fixed to 5.5 slm, and the effect on the loading effect when the ratio between the O$_2$ gas to the N$_2$ gas was changed was evaluated. In Example 3, as in Example 1, a silicon oxide film was deposited for each of a bare wafer and a pattern wafer under the process conditions (conditions F to J) illustrated in Table 3 below.

TABLE 2

| | ADSORPTION STEP (FLOW) | | | OXIDATION STEP (FLOW) | | | | |
|---|---|---|---|---|---|---|---|---|
| CONDI-TIONS | DIPAS [slm] | IP—N$_2$(O$_2$) [slm] | IP—N$_2$(Si) [slm] | O$_2$ [slm] | IP—N$_2$(O$_2$) [slm] | IP—N$_2$(Si) [slm] | RF [W] | PRESSURE [Pa] |
| C | 0.9 | 0.5 | 5 | 5 | 0.5 | 1 | 250 | 36.3 |
| D | 0.9 | 0.5 | 5 | 5 | 1.0 | 1 | 250 | 38.1 |
| E | 0.9 | 0.5 | 5 | 5 | 2.0 | 1 | 250 | 41.7 |

It should be noted that "DIPAS" and "IP-N$_2$(Si)" in Table 2 indicate the flow rate of the DIPAS gas and the flow rate of the N$_2$ gas supplied from the process gas supply pipe 9 into the process container 2, respectively. Also, in Table 2, "O$_2$" and "IP-N$_2$(O$_2$)" indicate the flow rate of the O$_2$ gas and the flow rate of the N$_2$ gas supplied from the process gas supply pipe 8 into the process container 2, respectively.

TABLE 3

| | ADSORPTION STEP (FLOW) | | | OXIDATION STEP (FLOW) | | | | | |
|---|---|---|---|---|---|---|---|---|---|
| CONDI-TIONS | DIPAS [slm] | IP—N$_2$(O$_2$) [slm] | IP—N$_2$(Si) [slm] | O$_2$ [slm] | IP—N$_2$(O$_2$) [slm] | O$_2$:IP—N$_2$(O$_2$) | IP—N$_2$(Si) [slm] | RF [W] | PRESSURE [Pa] |
| F | 0.9 | 0.5 | 5 | 5.000 | 0.50 | 10:1 | 1 | 250 | 36.3 |
| G | 0.9 | 0.5 | 5 | 4.538 | 0.92 | 5:1 | 1 | 250 | 36.3 |
| H | 0.9 | 0.5 | 5 | 4.400 | 1.10 | 4:1 | 1 | 250 | 36.2 |
| I | 0.9 | 0.5 | 5 | 4.125 | 1.38 | 3:1 | 1 | 250 | 36.1 |
| J | 0.9 | 0.5 | 5 | 3.667 | 1.83 | 2:1 | 1 | 250 | 36.0 |

It should be noted that "DIPAS" and "IP-N$_2$(Si)" in Table 3 indicate the flow rate of the DIPAS gas and the flow rate of the N$_2$ gas supplied from the process gas supply pipe 9 into the process container 2, respectively. Also, in Table 3, "O$_2$" and "IP-N$_2$(O$_2$)" indicate the flow rate of the O$_2$ gas and the flow rate of the N$_2$ gas supplied from the process gas supply pipe 8 into the process container 2, respectively. Also, in Table 3, "O$_2$:IP-N$_2$(O$_2$)" indicates the ratio between the O$_2$ gas and the N$_2$ gas supplied from the process gas supply pipe 8 into the process container 2. Also, in Table 3, "RF" indicates the output of radio frequency power applied between the pair of electrodes 11 from the radio frequency power source, and "pressure" indicates the in-furnace pressure.

As illustrated in Table 3, the conditions F, G, H, I, and J are the conditions in which the ratio of O$_2$ gas supplied from the process gas supply pipe 8 to N$_2$ gas was set to 10:1, 5:1, 4:1, 3:1, and 2:1, respectively, and all the conditions other than the ratio are the same.

FIGS. 8A and 8B are diagrams illustrating the evaluation results of Example 3. FIG. 8A indicates the relationship between the ratio between the O$_2$ gas and the N$_2$ gas supplied from the process gas supply pipe 8 into the process container 2 and the loading effect, and FIG. 8B indicates the relationship between the ratio between the O$_2$ gas and the N$_2$ gas supplied from the process gas supply pipe 8 into the process container 2 and the in-furnace pressure. In FIG. 8A, the horizontal axis indicates the ratio between the O$_2$ gas and the N$_2$ gas supplied from the process gas supply pipe 8 into the process container 2, and the vertical axis indicates the loading effect [%]. In FIG. 8B, the horizontal axis indicates the ratio between the O$_2$ gas and the N$_2$ gas supplied from the process gas supply pipe 8 into the process container 2, and the vertical axis indicates the in-furnace pressure [Pa]. The loading effect was calculated by the formula (1) described above.

As illustrated in FIG. 8A, when O$_2$:IP-N$_2$(O$_2$) was set to 10:1, 5:1, 4:1, 3:1, and 2:1, the loading effect was 9.62%, 6.8%, 5.82%, 5.74%, and 6.47%, respectively. As illustrated in FIG. 8B, when O$_2$:IP-N$_2$(O$_2$) was set to 10:1, 5:1, 4:1, 3:1, and 2:1, the in-furnace pressure was 36.27 Pa, 36.27 Pa, 36.23 Pa, 36.07 Pa, and 35.90 Pa, respectively. The results indicated that the loading effect is improved by changing the ratio between the O$_2$ gas and the N$_2$ gas supplied from the process gas supply pipe 8 into the process container 2 without changing the in-furnace pressure. Specifically, the results indicated that setting O$_2$:IP-N$_2$(O$_2$) to 5:1 to 2:1 improves the loading effect. In particular, the results indicated setting O$_2$:IP-N$_2$(O$_2$) to 3:1 particularly improves the loading effect.

It should be noted that in the embodiments as described above, the process gas supply pipes 8 and 9 are an example of a gas supply section, and the wafer W is an example of a substrate.

The embodiments disclosed herein should be considered to be exemplary in all respects and not restrictive. The above embodiments may be omitted, substituted, or modified in various forms without departing from the appended claims and spirit thereof.

What is claimed is:

1. A deposition method for depositing a silicon oxide film on a recess formed on a surface of each of a plurality of substrates in a process container, the deposition method comprising:
    a) calculating, by experiment or simulation, association information in which a ratio between an oxygen gas and an inert gas is associated with information regarding a loading effect for each pressure in the process container, followed by storing the association information in a memory;
    b) loading, to the process container, a wafer boat accommodating the substrates at predetermined intervals in a vertical direction;
    c) adsorbing a silicon-containing gas on the substrates;
    d) exposing the substrates to a plasma formed of an oxidizing gas containing an oxygen gas and an inert gas at a desired pressure; and
    e) repeating c) and d),
    wherein in d), a ratio between the oxygen gas and the inert gas is determined based on both the desired pressure and the association information stored in the memory, followed by supplying the oxygen gas and the inert gas in the determined ratio.

2. The deposition method according to claim 1, wherein d) is performed in a state in which an inside of the process container is evacuated by a vacuum pump.

3. The deposition method according to claim 1,
    wherein the inert gas is nitrogen gas, and
    wherein the ratio between the oxygen gas and the inert gas is 5:1 to 2:1.

4. A deposition apparatus comprising:
    a process container;
    a wafer boat configured to accommodate substrates at predetermined intervals in a vertical direction;
    a gas supply section configured to supply a process gas into the process container;
    an exhaust section configured to exhaust an inside of the process container; and
    a controller;
    a memory,
    wherein the controller is configured to execute
    a) storing, in the memory, association information in which a ratio between an oxygen gas and an inert gas is associated with information regarding a loading effect for each pressure in the process container, the association information being calculated by experiment or simulation;
    b) adsorbing a silicon-containing gas on the substrates;
    c) exposing the substrates to a plasma formed of an oxidizing gas containing an oxygen gas and an inert gas at a desired pressure; and
    d) repeating b) and c),
    to control the gas supply section and the exhaust section so as to deposit a silicon oxide film on a recess formed on a surface of each of the substrates in the process container,
    wherein in c), a ratio between the oxygen gas and the inert gas is determined based on both the desired pressure and the association information stored in the memory, followed by supplying the oxygen gas and the inert gas in the determined ratio.

* * * * *